US012580154B2

(12) United States Patent
Suda et al.

(10) Patent No.: US 12,580,154 B2
(45) Date of Patent: Mar. 17, 2026

(54) ETCHING METHOD AND PLASMA PROCESSING APPARATUS

(71) Applicant: Tokyo Electron Limited, Tokyo (JP)

(72) Inventors: Ryutaro Suda, Miyagi (JP); Koki Tanaka, Miyagi (JP); Ryu Nagai, Miyagi (JP); Masahiko Yokoi, Miyagi (JP); Ikko Tanaka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 180 days.

(21) Appl. No.: 18/237,067

(22) Filed: Aug. 23, 2023

(65) Prior Publication Data

US 2024/0071723 A1     Feb. 29, 2024

(30) Foreign Application Priority Data

Aug. 25, 2022    (JP) ................................. 2022-134371

(51) Int. Cl.
*H01J 37/32*          (2006.01)
*H01L 21/3065*          (2006.01)

(52) U.S. Cl.
CPC ... *H01J 37/32165* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 2017/0011887 A1* | 1/2017 | Deshmukh | ........ H01J 37/32431 |
| 2018/0019102 A1* | 1/2018 | Voronin | ........... H01J 37/32082 |
| 2022/0359167 A1* | 11/2022 | Orui | .................. H01J 37/32568 |
| 2025/0014872 A1* | 1/2025 | Koshimizu | ......... H01L 21/2015 |

FOREIGN PATENT DOCUMENTS

| | | |
|---|---|---|
| JP | 2012-227334 A | 11/2012 |
| JP | 2014-187231 A | 10/2014 |
| JP | 2016-207840 A | 12/2016 |
| JP | 20190807626 A | 6/2019 |
| JP | 2019-192874 A | 10/2019 |
| JP | 7075540 B1 | 5/2022 |
| WO | 2017126184 A1 | 7/2017 |

* cited by examiner

*Primary Examiner* — Shamim Ahmed
(74) *Attorney, Agent, or Firm* — XSENSUS LLP

(57) ABSTRACT

An etching method includes providing a substrate on a substrate support in a chamber of a plasma processing apparatus. The etching method further includes etching the substrate with plasma generated in the chamber, thereby forming a recess in the substrate. In the etching, an electrical bias is supplied to the substrate support, to attract ions from the plasma into the substrate. In the etching, at least one of a bias frequency, which is a reciprocal of a time length of a waveform cycle of the electrical bias, and a pulse duty ratio of a pulsed electrical bias is modified to maintain an ion energy flux to the substrate.

6 Claims, 6 Drawing Sheets

FIG. 3A
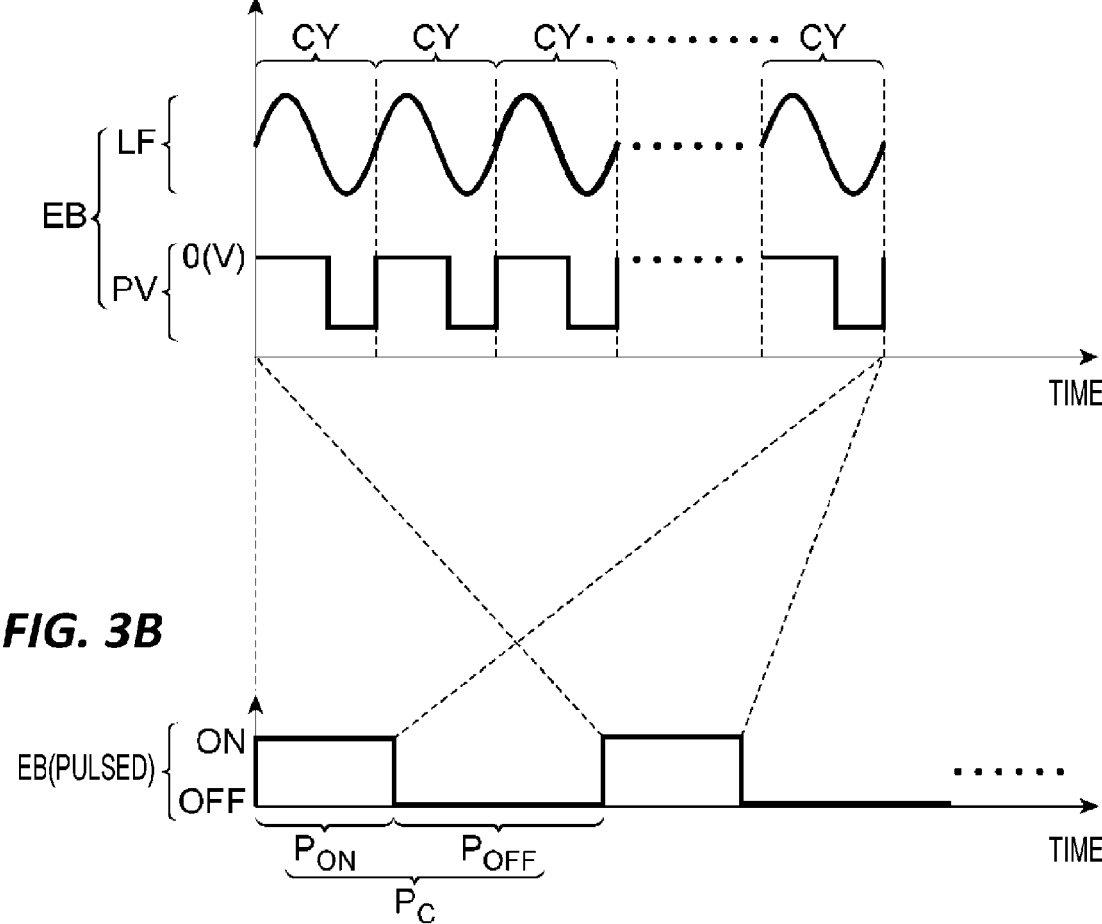
FIG. 3B
FIG. 3C
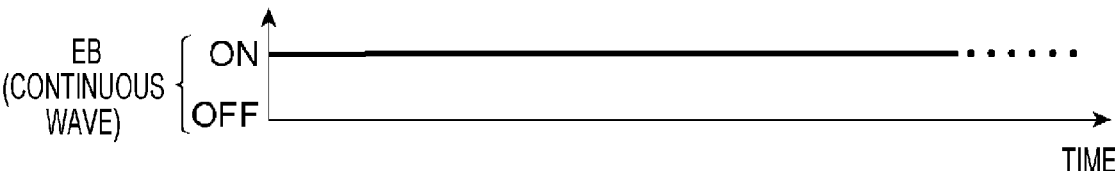

ETCHING METHOD AND PLASMA PROCESSING APPARATUS

CROSS-REFERENCE TO RELATED APPLICATIONS

This application is based on and claims priority from Japanese Patent Application No. 2022-134371, filed on Aug. 25, 2022, with the Japan Patent Office, the disclosure of which is incorporated herein in its entirety by reference.

TECHNICAL FIELD

The present disclosure relates to an etching method and a plasma processing apparatus.

BACKGROUND

A plasma processing apparatus is used for etching a substrate. The plasma processing apparatus includes a chamber, a substrate support unit, a radio-frequency power supply, and a bias power supply. The substrate support unit is provided inside the chamber. The radio-frequency power supply supplies a source radio-frequency power for generating plasma. The bias power supply supplies a bias radio-frequency power to the substrate support unit, in order to attract ions into a substrate. Japanese Patent Laid-Open Publication No. 2014-187231 discloses a plasma etching that uses the plasma processing apparatus.

SUMMARY

An embodiment provides an etching method. The etching method includes providing a substrate on a substrate support in a chamber of a plasma processing apparatus. The etching method further includes etching the substrate with plasma generated in the chamber, thereby forming a recess in the substrate. In the etching, an electrical bias is supplied to the substrate support, to attract ions from the plasma into the substrate. In the etching, at least one of a bias frequency, which is a reciprocal of a time length of a waveform cycle of the electrical bias, and a pulse duty ratio of a pulsed form of the electrical bias is modified to maintain an ion energy flux to the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 3A to 3C are each a timing chart of an electrical bias related to a plasma processing apparatus according to an embodiment.

DETAILED DESCRIPTION

Figure 1:
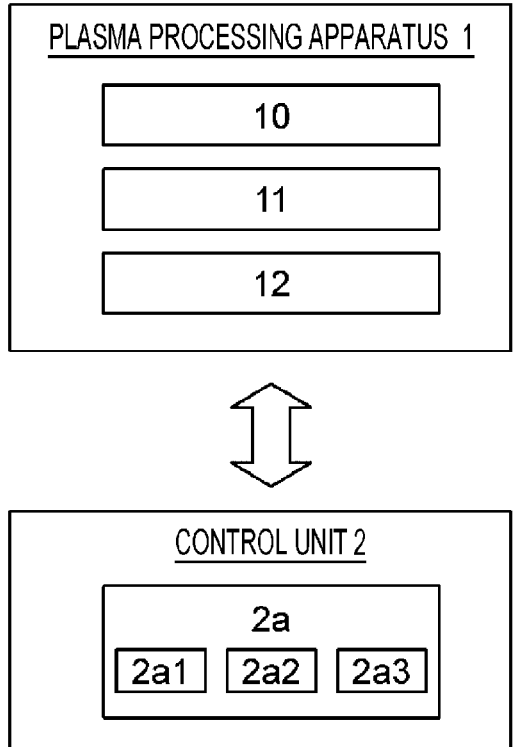
FIG. 1 is a view illustrating an example of a configuration of a plasma processing system.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described with reference to the drawings. In the respective drawings, similar or corresponding portions will be denoted by the same reference numerals.

FIG. 1 is a view illustrating an example of a configuration of a plasma processing system. In an embodiment, the plasma processing system includes a plasma processing apparatus 1 and a control unit 2. The plasma processing system is an example of a substrate processing system, and the plasma processing apparatus 1 is an example of a substrate processing apparatus. The plasma processing apparatus 1 includes a plasma processing chamber 10, a substrate support unit 11, and a plasma generation unit 12. The plasma processing chamber 10 has a plasma processing space. Further, the plasma processing chamber 10 includes at least one gas supply port for supplying at least one processing gas to the plasma processing space, and at least one gas discharge port for discharging a gas from the plasma processing space. The gas supply port is connected to a gas supply unit 20 to be described later, and the gas discharge port is connected to an exhaust system 40 to be described later. The substrate support unit 11 is disposed in the plasma processing space, and has a substrate support surface for supporting a substrate.

The plasma generation unit 12 is configured to generate plasma from at least one processing gas supplied into the plasma processing space. The plasma formed in the plasma processing space may be, for example, capacitively coupled plasma (CCP), inductively coupled plasma (ICP), electron-cyclotron-resonance (ECR) plasma, helicon wave plasma (HWP), or surface wave plasma (SWP).

The control unit 2 processes computer-executable commands for causing the plasma processing apparatus 1 to execute various steps described herein. The control unit 2 may be configured to control each component of the plasma processing apparatus 1 to perform the various steps described herein. In an embodiment, a portion of the control unit 2 or the entire control unit 2 may be included in the plasma processing apparatus 1. The control unit 2 may include a processing unit 2a1, a storage unit 2a2, and a communication interface 2a3. The control unit 2 is implemented by, for example, a computer 2a. The processing unit 2a1 may be configured to read programs from the storage unit 2a2, and perform various control operations by executing the read programs. The programs may be stored in the storage unit 2a2 in advance, or may be acquired via a medium when necessary. The acquired programs are stored in the storage unit 2a2, and read from the storage unit 2a2 to be executed by the processing unit 2a1. The medium may be any of various storage media readable by the computer 2a, or may be a communication line connected to the communication interface 2a3. The processing unit 2a1 may be a central processing unit (CPU). The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 through a communication line such as a local area network (LAN).

Figure 2:
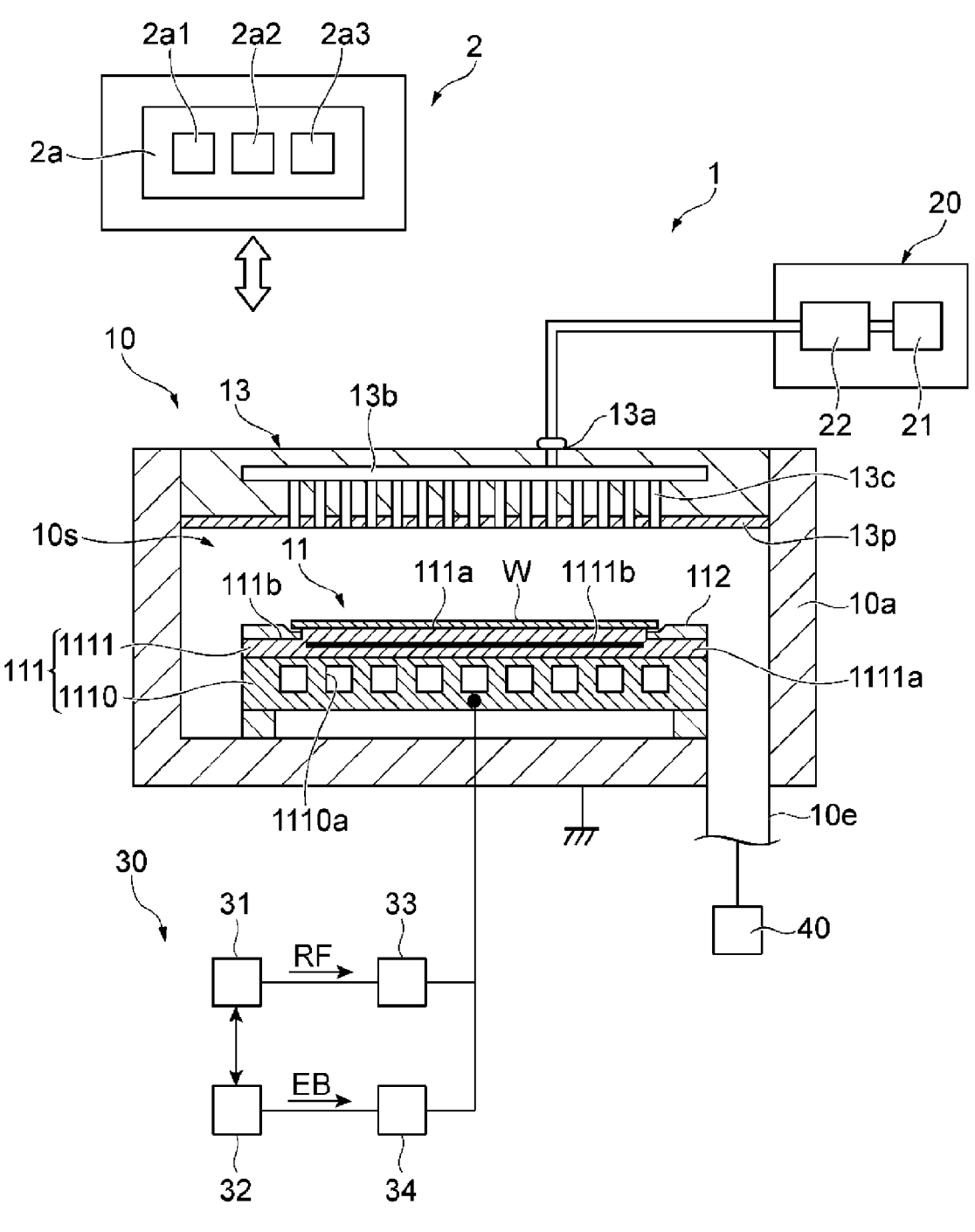
FIG. 2 is a view illustrating an example of a configuration of a capacitively coupled plasma processing apparatus.

Hereinafter, an example of a configuration of a capacitively coupled plasma processing apparatus, which is an example of the plasma processing apparatus 1, will be described. FIG. 2 is a view illustrating an example of a configuration of the capacitively coupled plasma processing apparatus.

The capacitively coupled plasma processing apparatus 1 includes the plasma processing chamber 10, the gas supply unit 20, a power supply system 30, and the exhaust system 40. Further, the plasma processing apparatus 1 includes the substrate support unit 11 and a gas introduction unit. The gas introduction unit is configured to introduce at least one processing gas into the plasma processing chamber 10. The gas introduction unit includes a shower head 13. The substrate support unit 11 is disposed inside the plasma processing chamber 10. The shower head 13 is disposed above the substrate support unit 11. In an embodiment, the shower head 13 makes up at least a portion of the ceiling of the plasma processing chamber 10. The plasma processing chamber 10 has a plasma processing space 10s defined by the shower head 13, the side wall 10a of the plasma processing chamber 10, and the substrate support 11. The plasma processing chamber 10 is grounded. The substrate support unit 11 is electrically insulated from the housing of the plasma processing chamber 10.

The substrate support unit 11 includes a main body 111 and a ring assembly 112. The main body 111 has a central region 111a for supporting a substrate W, and an annular region 111b for supporting the ring assembly 112. A wafer is an example of the substrate W. The annular region 111b of the main body 111 surrounds the central region 111a of the main body 111 in plan view. The substrate W is placed on the central region 111a of the main body 111, and the ring assembly 112 is disposed on the annular region 111b of the main body 111 to surround the substrate W placed on the central region 111a of the main body 111. Accordingly, the central region 111a is also referred to as a substrate support surface for supporting the substrate W thereon, and the annular region 111b is also referred to as a ring support surface for supporting the ring assembly 112.

In an embodiment, the main body 111 includes a base 1110 and an electrostatic chuck 1111. The base 1110 includes a conductive member. The electrostatic chuck 1111 is disposed on the base 1110. The electrostatic chuck 1111 includes a ceramic member 1111a and an electrostatic electrode 1111b disposed inside the ceramic member 1111a. The ceramic member 1111a has the central region 111a. In an embodiment, the ceramic member 1111a also has the annular region 111b. Another member surrounding the electrostatic chuck 1111, such as an annular electrostatic chuck or an annular insulating member, may have the annular region 111b. In this case, the ring assembly 112 may be disposed on the annular electrostatic chuck or the annular insulating member, or may be disposed on both the electrostatic chuck 1111 and the annular insulating member.

The ring assembly 112 includes one or a plurality of annular members. In an embodiment, one or a plurality of annular members include one or a plurality of edge rings and at least one cover ring. The edge ring is made of a conductive material or an insulating material, and the cover ring is made of an insulating material.

The substrate support unit 11 may include a temperature adjustment module configured to adjust at least one of the electrostatic chuck 1111, the ring assembly 112, and the substrate to a target temperature. The temperature adjustment module may include a heater, a heat transfer medium, a flow path 1110a, or a combination thereof. A heat transfer fluid such as brine and a gas flows through the flow path. In an embodiment, the flow path 1110a is formed inside the base 1110, and one or a plurality of heaters is disposed inside the ceramic member 1111a of the electrostatic chuck 1111. The substrate support unit 11 may include a heat transfer gas supply unit configured to supply a heat transfer gas to the gap between the back surface of the substrate W and the central region 111a.

The shower head 13 is configured to introduce at least one processing gas from the gas supply unit 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes at least one upper electrode. The gas introduction unit may include one or a plurality of side gas injectors (SGI) attached to one or a plurality of openings formed in the side wall 10a, in addition to the shower head 13.

The gas supply unit 20 may include at least one gas source 21 and at least one flow rate controller 22. In an embodiment, the gas supply unit 20 is configured to supply at least one processing gas from its corresponding gas source 21 to the shower head 13 via its corresponding flow rate controller 22. Each flow rate controller 22 may include, for example, a mass flow controller or a pressure-controlled flow rate controller. The gas supply unit 20 may further include at least one flow rate modulation device that modulates or pulses the flow rate of at least one processing gas.

The exhaust system 40 may be connected to a gas exhaust port 10e provided at, for example, the bottom of the plasma processing chamber 10. The exhaust system 40 may include a pressure regulation valve and a vacuum pump. The pressure in the plasma processing space 10s is regulated by the pressure regulation valve. The vacuum pump may include a turbo molecular pump, a dry pump, or a combination thereof.

The power supply system 30 includes a radio-frequency power supply 31 and a bias power supply 32. The radio-frequency power supply 31 makes up the plasma generation unit 12 of an embodiment. The radio-frequency power supply 31 is configured to generate a source radio-frequency power RF. The source radio-frequency power RF has a source frequency $f_{RF}$. That is, the source radio-frequency power RF has a sinusoidal waveform, of which frequency is the source frequency $f_{RF}$. The source frequency $f_{RF}$ may be a frequency in the range of 13 MHz to 100 MHz. The radio-frequency power supply 31 is electrically connected to a radio-frequency electrode via a matching unit 33, and is configured to supply the source radio-frequency power RF to the radio-frequency electrode. The radio-frequency electrode may be provided inside the substrate support unit 11. The radio-frequency electrode may be at least one electrode provided inside the conductive member of the base 1110 or the ceramic member 1111a. Alternatively, the radio-frequency electrode may be an upper electrode. When the source radio-frequency power RF is supplied to the radio-frequency electrode, plasma is generated from a gas in the chamber 10.

The matching unit 33 has a variable impedance. The variable impedance of the matching unit 33 is set to reduce the reflection of the source radio-frequency power RF from a load. The matching unit 33 may be controlled by, for example, the control unit 2.

The bias power supply 32 is electrically coupled to the substrate support unit 11. The bias power supply 32 is electrically connected to a bias electrode inside the substrate support unit 11, and is configured to supply an electrical bias EB to the bias electrode. The bias electrode may be at least one electrode provided in the conductive member of the base 1110 or the ceramic member 1111*a*. The bias electrode may be common with the radio-frequency electrode. When the electrical bias EB is supplied to the bias electrode, ions from the plasma are attracted into the substrate W.

Hereinafter, FIGS. 3A to 3C will be referred to, along with FIG. 2. FIGS. 3A to 3C are each a timing chart of an electrical bias related to a plasma processing apparatus according to an embodiment. The electrical bias EB has a waveform cycle CY, and is periodically supplied to the bias electrode from the bias power supply 32. The waveform cycle of the electrical bias EB is defined by the bias frequency $f_{EB}$. The bias frequency $f_{EB}$ is, for example, 100 kHz or more and 50 Mhz or less. The time length of the waveform cycle CY of the electrical bias EB is the reciprocal of the bias frequency $f_{EB}$.

The electrical bias EB may be a bias radio-frequency power LF having the bias frequency $f_{EB}$. That is, the electrical bias EB may have a sinusoidal waveform, of which frequency is the bias frequency $f_{EB}$. In this case, the bias power supply 32 is electrically connected to the bias electrode via a matching unit 34. The variable impedance of the matching unit 34 is set to reduce the reflection of the bias radio-frequency power LF from a load.

The electrical bias EB may include a voltage pulse PV. The voltage pulse PV is applied to the bias electrode within the waveform cycle CY. The voltage pulse PV is periodically applied to the bias electrode at an interval of the same time length as the time length of the waveform cycle CY. The waveform of the voltage pulse PV may be a square wave, a triangular wave, or any other waveforms. The polarity of the voltage of the voltage pulse PV is set to cause a difference in potential between the substrate W and plasma, thereby attracting ions from the plasma into the substrate W. The voltage pulse PV may be a negative voltage pulse or a negative DC voltage pulse. When the electrical bias EB includes the voltage pulse PV, the plasma processing apparatus 1 may not include the matching unit 34.

Figure 6:
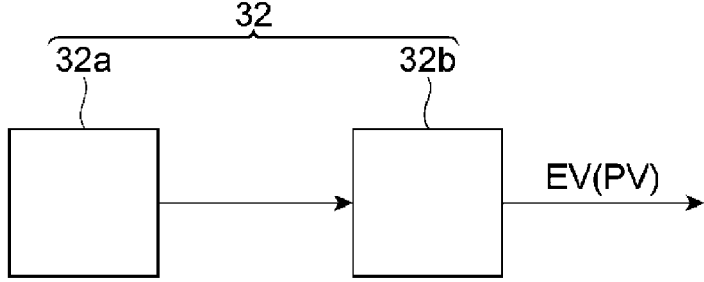
FIG. 6 is a view illustrating an example of a bias power supply.

In an embodiment, the bias power supply 32 may include a DC power supply 32*a* and a modulator 32*b*, as illustrated in FIG. 6. The modulator 32*b* is configured to modulate a voltage output from the DC power supply 32*a* (e.g., a DC voltage), thereby generating the voltage pulse PV.

As illustrated in FIG. 3B, the bias power supply 32 may supply a pulsed electrical bias EB. That is, the bias power supply 32 may alternately repeat the supply of the electrical bias EB ("ON" in FIG. 3B) and the stop of the supply of the electrical bias EB ("OFF" in FIG. 3B). In a pulse cycle $P_C$ including a period $P_{ON}$ during which the electrical bias EB is supplied and a period $P_{OFF}$ during which the supply of the electrical bias EB is stopped, the proportion of the period $P_{ON}$, i.e., the pulse duty ratio PD may be specified from the control unit 2 to the bias power supply 32. The electrical bias EB is supplied periodically in the waveform cycle CY within each period $P_{ON}$.

As illustrated in FIG. 3C, the electrical bias EB may be supplied as a continuous wave. That is, the electrical bias EB may be supplied continuously until the supply is stopped.

The electrical bias EB is supplied periodically in the waveform cycle CY until the supply is stopped.

Figure 4:
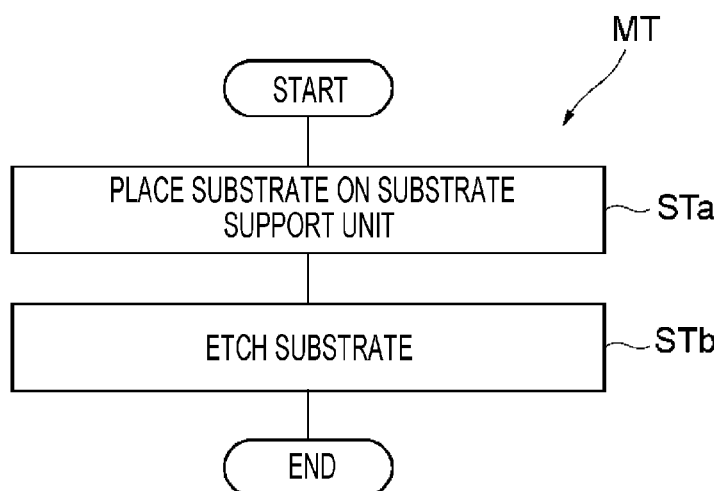
FIG. 4 is a flowchart of an etching method according to an embodiment.

Hereinafter, an etching method according to an embodiment will be described with reference to FIGS. 4 and 5A to 5D. FIG. 4 is a flowchart of an etching method according to an embodiment. FIGS. 5A to 5D are each a timing chart of an electrical bias related to an etching method according to an embodiment.

The etching method illustrated in FIG. 4 (hereinafter, referred to as a "method MT") may be performed using the plasma processing apparatus 1. The method MT may be performed through the control of each component of the plasma processing apparatus 1 by the control unit 2.

The method MT starts from step STa. In step STa, the substrate W is placed on the substrate support unit 11.

Next, step STb is performed. In step STb, the substrate W is etched by plasma generated in the chamber 10 to form a recess in the substrate W. In step STb, for example, a film of the substrate W is etched.

In step STb, the gas supply unit 20 is controlled to supply a processing gas into the chamber 10. In step STb, the exhaust system 40 is controlled to regulate the pressure in the chamber 10 to a specified pressure. In step STb, the plasma generation unit 12 is controlled to generate plasma from the processing gas. In an embodiment, the radio-frequency power supply 31 is controlled to supply the source radio-frequency power RF for generating plasma. Further, in step STb, the bias power supply 32 is controlled to supply the electrical bias EB to the substrate support 11, in order to attract ions from the plasma.

In step STb, the bias power supply 32 modifies at least one of the bias frequency $f_{EB}$ and the pulse duty ratio PD to maintain the ion energy flux to the substrate W.

The etching rate depends on the product of the ion energy and the amount of ions supplied, i.e., the ion flux. In the method MT, the bias frequency $f_{EB}$ or the pulse duty ratio PD is modified to maintain the product of the ion energy and the ion flux, i.e., the ion energy flux to the substrate W. Thus, according to the method MT, it is possible to increase the etching rate in the etching for forming a recess having a high aspect ratio in the substrate W.

Figure 5A:
FIGS. 5A to 5D are each a timing chart of an electrical bias related to an etching method according to an embodiment.

In an embodiment, as illustrated in FIG. 5A, during step ST2, the bias power supply 32 may decrease the bias frequency $f_{EB}$ as time elapses. The ion energy increases as the bias frequency $f_{EB}$ decreases. Thus, in this case, the energy of ions supplied to the substrate W increases as the depth of a recess formed in the substrate W increases. The ion flux decreases as the bias frequency $f_{EB}$ decreases. Accordingly, by decreasing the bias frequency $f_{EB}$ with the elapse of time, the ion energy flux may be maintained.

Figure 5B:
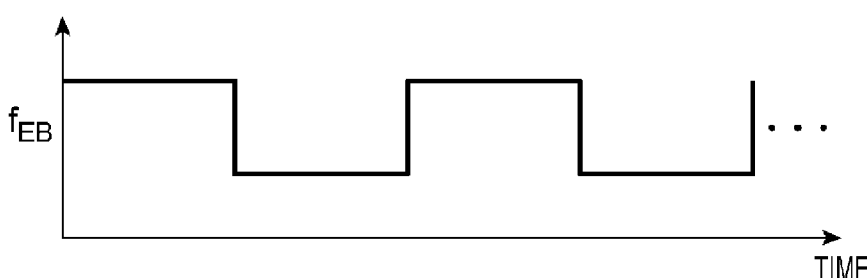

In another embodiment, as illustrated in FIG. 5B, during step ST2, the bias power supply 32 may alternately increase and decrease the bias frequency $f_{EB}$. When the bias frequency $f_{EB}$ is low, the ion energy increases, and when the bias frequency $f_{EB}$ is high, the ion flux increases. By alternately increasing and decreasing the bias frequency $f_{EB}$, the ion energy flux may be maintained.

Figure 5C:
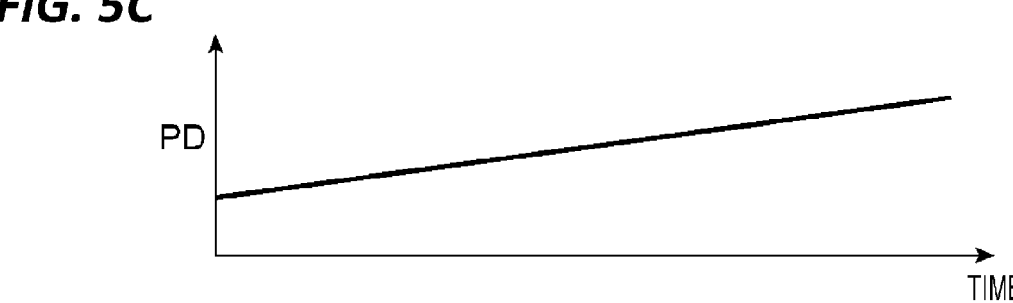

In yet another embodiment, as illustrated in FIG. 5C, during step ST2, the bias power supply 32 may increase the pulse duty ratio PD as time elapses. The ion energy increases as the pulse duty ratio PD increases. Thus, in this case, the energy of ions supplied to the substrate W increases as the depth of the recess formed in the substrate W increases. The ion flux decreases as the pulse duty ratio PD increases. Accordingly, by increasing the pulse duty ratio PD with the elapse of time, the ion energy flux may be maintained.

Figure 5D:
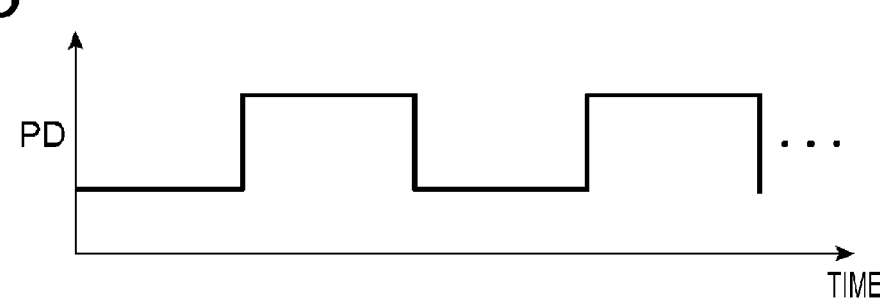

In yet another embodiment, as illustrated in FIG. 5D, during step ST2, the bias power supply 32 may alternately increase and decrease the pulse duty ratio PD. When the pulse duty ratio PD is high, the ion energy increases, and when the pulse duty ratio PD is low, the ion flux increases. By alternately increasing and decreasing the pulse duty ratio PD, the ion energy flux may be maintained.

While various embodiments have been described, various additions, omissions, substitutions, and modifications may be made without being limited to the above-described embodiments. Further, elements in the different embodiments may be combined to form another embodiment.

Here, various embodiments included in the present disclosure are described in [E1] to [E13] below.

[E1]

An etching method including:

disposing a substrate on a substrate support in a chamber of a plasma processing apparatus; and etching the substrate with plasma generated in the chamber, thereby forming a recess in the substrate, wherein in the etching, an electrical bias is supplied to the substrate support, to attract ions from the plasma into the substrate, and in the etching, at least one of a bias frequency, which is a reciprocal of a time length of a waveform cycle of the electrical bias, and a pulse duty ratio of a pulsed electrical bias is modified to maintain an ion energy flux to the substrate.

The etching rate depends on the product of the ion energy and the amount of ions supplied, i.e., the ion flux. In the embodiment [E1], the bias frequency $f_{EB}$ or the pulse duty ratio PD is modified to maintain the product of the ion energy and the ion flux, i.e., the ion energy flux to the substrate W. Thus, it is possible to increase the etching rate in the etching for forming a recess having a high aspect ratio in the substrate W.

[E2]

The etching method according to [E1], wherein in the etching, the bias frequency is decreased as a time elapses.

[E3]

The etching method according to [E1], wherein in the etching, the bias frequency is alternately increased and decreased.

[E4]

The etching method according to [E1], wherein in the etching, the pulse duty ratio is increased as a time elapses.

[E5]

The etching method according to [E1], wherein in the etching, the pulse duty ratio is alternately increased and decreased.

[E6]

The etching method according to any one of [E1] to [E5], wherein the electrical bias is a bias radio-frequency power having the bias frequency or a voltage pulse periodically supplied at a time interval of a reciprocal of the bias frequency.

[E7]

A plasma processing apparatus including:

a chamber;

a substrate support provided inside the chamber;

a plasma generator configured to generate plasma from a gas in the chamber; and a bias power supply configured to generate an electrical bias for attracting ions into a substrate disposed on the substrate support, wherein the bias power supply is configured to modify at least one of a bias frequency, which is a reciprocal of a time length of a waveform cycle of the electrical bias, and a pulse duty ratio of a pulsed electrical bias, to maintain an ion energy flux to the substrate.

[E8]

The plasma processing apparatus according to [E7], wherein the bias power supply is configured to decrease the bias frequency as a time elapses.

[E9]

The plasma processing apparatus according to [E7], wherein the bias power supply is configured to alternately increase and decrease the bias frequency.

[E10]

The plasma processing apparatus according to [E7], wherein the bias power supply is configured to increase the pulse duty ratio as a time elapses.

[E11]

The plasma processing apparatus according to [E7], wherein the bias power supply is configured to alternately increase and decrease the pulse duty ratio.

[E12]

The plasma processing apparatus according to any one of [E7] to [E11], wherein the electrical bias is a bias radio-frequency power having the bias frequency or a voltage pulse periodically supplied at a time interval of a reciprocal of the bias frequency.

[E13]

The plasma processing apparatus according to [E12], wherein the bias power supply includes a DC power supply, and a modulator configured to modulate a voltage output from the DC power supply, thereby generating the voltage pulse.

According to an embodiment, it is possible to increase an etching rate during an etching for forming a recess having a high aspect ratio in a substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising: providing a substrate on a substrate support in a chamber of a plasma processing apparatus; and etching the substrate with plasma generated in the chamber, thereby forming a recess in the substrate, wherein in the etching, an electrical bias is supplied to the substrate support, to attract ions from the plasma into the substrate, and in the etching, at least one of a bias frequency, which is a reciprocal of a time length of a waveform cycle of the electrical bias, and a pulse duty ratio of a pulsed electrical bias is modified to maintain an ion energy flux to the substrate.

2. The etching method according to claim 1, wherein in the etching, the bias frequency is decreased as a time elapses.

3. The etching method according to claim 1, wherein in the etching, the bias frequency is alternately increased and decreased.

4. The etching method according to claim 1, wherein in the etching, the pulse duty ratio is increased as a time elapses.

5. The etching method according to claim 1, wherein in the etching, the pulse duty ratio is alternately increased and decreased.

6. The etching method according to claim 1, wherein the electrical bias is a bias radio-frequency power having the bias frequency or a voltage pulse periodically supplied at a time interval of a reciprocal of the bias frequency.

\* \* \* \* \*